(12) United States Patent
Kinoshita

(10) Patent No.: US 8,018,507 B2
(45) Date of Patent: Sep. 13, 2011

(54) SOLID-STATE IMAGE SENSING DEVICE AND ELECTRONIC APPARATUS COMPRISING SAME

(75) Inventor: Kazuo Kinoshita, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 420 days.

(21) Appl. No.: 12/080,462

(22) Filed: Apr. 3, 2008

(65) Prior Publication Data
US 2008/0246866 A1 Oct. 9, 2008

(30) Foreign Application Priority Data
Apr. 4, 2007 (JP) ................................. 2007-098804

(51) Int. Cl.
H04N 5/225 (2006.01)
H04N 9/07 (2006.01)
(52) U.S. Cl. ........................ 348/262; 348/336
(58) Field of Classification Search .................. 348/373, 348/374
See application file for complete search history.

(56) References Cited

U.S. PATENT DOCUMENTS

| 5,274,456 | A | | 12/1993 | Izumi et al. | |
|---|---|---|---|---|---|
| 6,122,009 | A | * | 9/2000 | Ueda | 348/335 |
| 7,656,452 | B2 | * | 2/2010 | Saito et al. | 348/340 |
| 7,664,390 | B2 | * | 2/2010 | Cho et al. | 396/542 |
| 2001/0050721 | A1 | * | 12/2001 | Miyake | 348/374 |
| 2002/0128539 | A1 | * | 9/2002 | Higuma et al. | 600/133 |
| 2004/0077121 | A1 | | 4/2004 | Maeda et al. | |
| 2004/0189854 | A1 | | 9/2004 | Tsukamoto et al. | |
| 2005/0099532 | A1 | * | 5/2005 | Tseng | 348/374 |
| 2006/0186499 | A1 | | 8/2006 | Maeda et al. | |
| 2006/0219884 | A1 | | 10/2006 | Tsukamoto et al. | |
| 2006/0221225 | A1 | | 10/2006 | Tsukamoto et al. | |
| 2006/0252174 | A1 | | 11/2006 | Maeda et al. | |
| 2006/0252175 | A1 | | 11/2006 | Maeda et al. | |
| 2006/0284215 | A1 | | 12/2006 | Maeda et al. | |
| 2007/0229702 | A1 | * | 10/2007 | Shirono et al. | 348/374 |

(Continued)

FOREIGN PATENT DOCUMENTS
CN 1842136 A 10/2006
(Continued)

OTHER PUBLICATIONS
U.S. Appl. No. 12/080,478, filed Apr. 3, 2008, Kinoshita.
(Continued)

Primary Examiner — James Hannett
(74) Attorney, Agent, or Firm — Edwards Angell Palmer & Dodge LLP; David G. Conlin; David A. Tucker

(57) ABSTRACT

A camera module 100*a* of the present invention includes a lens unit 10*a* which includes a lens 11 and a lens holder 12 holding the lens 11 therein, and an image sensing unit 20*a* which includes a solid-state image sensor 24 and a transparent lid section 26 which is arranged so as to face the receiving surface of the solid-state image sensor 24, provided with a space S therebetween. The transparent lid section 26 and the lens 11 are independent of each other, and the lens 11 is aligned with respect to the solid-state image sensor 24 by engaging the transparent lid section 26 with the lens holder 12 by mounting the lens 11 on the transparent lid section 26. Thus, it is possible to provide a solid-state image sensing device having high lens alignment precision with respect to a solid-state image sensor.

15 Claims, 7 Drawing Sheets

U.S. PATENT DOCUMENTS

2009/0290062 A1* 11/2009 Minamio et al. ............. 348/340
2009/0302205 A9* 12/2009 Olsen et al. ................. 250/226

FOREIGN PATENT DOCUMENTS

| | | |
|---|---|---|
| CN | 1842137 A | 10/2006 |
| JP | 7-273365 A | 10/1995 |
| JP | 11-261861 A | 9/1999 |
| JP | 2000-196111 A | 7/2000 |
| JP | 2002-329851 A | 11/2002 |
| JP | 2005-094340 A | 4/2005 |
| JP | 2006-267391 A | 10/2006 |
| KR | 2007-12185 A | 1/2007 |

OTHER PUBLICATIONS

U.S. Office Action in U.S. Appl. No. 12/080,478, dated Dec. 30, 2010.

* cited by examiner

SOLID-STATE IMAGE SENSING DEVICE AND ELECTRONIC APPARATUS COMPRISING SAME

This Nonprovisional application claims priority under 35 U.S.C. §119(a) on Patent Application No. 098804/2007 filed in Japan on Apr. 4, 2007, the entire contents of which are hereby incorporated by reference.

FIELD OF THE INVENTION

The present invention relates to a solid-state image sensing device and an electronic apparatus.

BACKGROUND OF THE INVENTION

Solid-state image sensing devices (camera modules) applied to cameras built in portable phones usually incorporate a solid-state image sensor, a signal processing device (DSP), a lens, a lens holder, a lens barrel, and other components in a package.

A mainstream of conventional solid-state image sensing devices are mainly single-focus types, however recently, there is an increasing demand for highly functioned solid-state image sensing devices of high pixel number and a high image quality. Portable phones are also in this trend nowadays. The solid-state image sensing devices built in portable phones have a high pixel number and functions such as zooming or automatic focusing due to an optical mechanism equivalently to a machine specialized for capturing an image, such as a digital still camera. Furthermore, the portability of the portable phones promotes integration of a semiconductor (sensor, IC for signal processing), a plurality of lens or an optical mechanism, driving devices (such as a motor) for driving the plurality of lens or the optical mechanism, and other components in the solid-state image sensing device.

A product cycle of the portable phone is however short, and the portable phones tend to quickly be changed to a next model. Therefore, the solid-state image sensing device to be installed to the portable phones requires to be manufactured in mass in a short period of time. In order to fulfill this demand, not only the product reliability, but also the easy assembling the solid-state image sensing device is an important factor.

Furthermore, it is important to satisfy the following two conditions in order to manufacture the solid-state image sensing device:

(a) an optical center of an image sensing surface of a solid-state image sensor is concentric to an optical axis of a lens; and
(b) a plane surface of the image sensing surface and the optical axis of the lens are orthogonal to each other.

These conditions are the conditions required for a lens alignment with respect to the solid-state image sensor.

The conventional solid-state image sensing devices without the high functions easily satisfy the two conditions, even for small-sized, lightweight solid-state image sensing devices. However, the recent solid-state image sensing devices with the high-functions require accurate and highly precise structural members, and also require a highly defined receiving section of the solid-state image sensor. Therefore, in order to manufacture such solid-state image sensing devices, it is necessary to meet the two conditions more severely.

In addition, particularly for the solid-state image sensing devices applied to cameras built in the portable phones, compactness and reduction in weight are also demanded. Therefore, a complex compensation mechanism applicable to common cameras may not be applied to such solid-state image sensing devices.

Therefore, conventionally, the solid-state image sensing device is manufactured so that the aforementioned two conditions are satisfied, assuming that the solid-state image sensor is mounted parallel to the circuit board. Namely, the circuit board is the basis of the alignment. More specifically, an image sensing surface (receiving surface) of the solid-state image sensor and the circuit board of which the solid-state image sensor is to be mounted are assumed to be parallel (same) to each other. With this presupposition, the lens (or the lens holder) is mounted, based on a plane surface of the circuit board.

However, the actual circuit boards have manufacturing variation. Therefore, there is a limit in the precision in assembling and mounting the solid-state image sensing devices. Focusing adjustment (optical adjustment) after the assembling of the camera module is thus essential. The camera module also requires selection of the most appropriate material so as to satisfy its specification.

However, if the alignment is performed based on the circuit board, half blur of a focus may occur. The half blur denotes a state where the focusing of the image is uneven between a top and a bottom or a left and a right of the image. In addition, the focusing requires high-cost investment in plant and equipment, as well as manpower, and further requires considerable skill. Therefore, plenty of work hours are also required.

Each of Patent Documents 1 and 2, for example, discloses a solid-state image sensing device where the alignment is performed not based on the circuit board. FIG. 11 is a cross sectional view of the solid-state image sensing device of Patent Document 1. FIG. 12 is a cross sectional view of the solid-state image sensing device of Patent Document 2.

As illustrated in FIG. 11, a solid-state image sensing device 500 is subjected to alignment of a lens 511 with respect to a solid-state image sensor 524 in a part close to an image sensing surface of the solid-state image sensor 524. More specifically, in the solid-state image sensing device 500, positions of a transparent lid section 526 and a lens holder 510 are set by an adhesive applied on a joining section 520 on a surface of a transparent lid section 526.

As illustrated in FIG. 12, in a solid-state image sensing device 600, a glass substrate 626 is a sealing cover glass with a lens array, in which the glass substrate 626 itself has a condensing function and a image forming function. The glass substrate 626 is adhered on a solid-state image sensor substrate 620 by an adhesive layer 625 formed on the glass substrate 626. As such, in the solid-state image sensing device 600, the alignment of each of the substrates are performed referring to an alignment mark provided on a fringe section of each of the substrates.

Patent Document 1
Japanese Unexamined Patent Publication, Tokukai, No. 2004-301938 (published Oct. 28, 2004)
Patent Document 2
Japanese Unexamined Patent Publication, Tokukai, No. 2004-031499 (published Jan. 29, 2004)

However, it is difficult to say that the conventional solid-state image sensing devices satisfy the strictly required lens alignment precision. Therefore, in order to provide highly functional solid-state image sensing devices, it is necessary to further improve the lens alignment precision.

More specifically, in the solid-state image sensing device 500 of Patent Document 1, the alignment of the lens holder 510 is based on the surface of the transparent lid section 526. However, such alignment solely aligns the lens holder 510 with respect to the solid-state image sensor 524. Namely, the alignment precision of the lens 511 to the lens holder 510 is completely not considered. Therefore, it is difficult to say that the lens 511 is aligned in high precision. Particularly, if the alignment precision (precision of the holding position) of the lens 511 by the lens holder 510 is poor, the alignment precision of the lens 511 with respect to the solid-state image sensor 524 becomes poor.

In addition, the solid-state image sensing device 500 uses the surface of the transparent lid section 526 as the basis of the alignment. This makes it possible to attain alignment in a vertical direction (stacking direction), however cannot attain sufficient alignment in a plane direction (horizontal direction; direction perpendicular to the vertical direction).

In the solid-state image sensing device 500, a joining section 520 is provided on a peripheral part of the transparent lid section 526. Therefore, if the manufacturing variation (warp, bend) of the circuit board 521 is great, the alignment precision of the lens 511 also becomes poor. As a result, for example, if the variation of the circuit board 521 is in the horizontal direction (plane surface direction) of the transparent lid section 526, obviously the alignment precision of the lens 511 is also poor. If the warp or the bend of the circuit board 521 is great, the joining section 520 cannot be secured, thereby the alignment of the lens 511 is not possible.

As such, the lens alignment precision with respect to the solid-state image sensor is insufficient in the arrangement of Patent Document 1.

Furthermore, both of the solid-state image sensing devices of Patent Documents 1 and 2 have a fixed focal length (is a single-focused type). Therefore, the solid-state image sensing devices of Patent Documents 1 and 2 are not suitable for recent solid-state image sensing devices, which have the demand for high function. Particularly, the solid-state image sensing device 600 of Patent Document 2 has an object to reduce size and improve reliability of the solid-state image sensing device. The object is attained by mounting no optical member on the solid-state image sensing device 600. The optical member is unnecessary due to use of the glass substrate 626 which possesses the condensing function. Therefore, an addition of a zooming function or an automatic focusing function would contradict with the object. That is to say, an object of the solid-state image sensing device 600 of Patent Document 2 is to address a problem unique to an arrangement where a microlens is equipped on the image sensing surface of the solid-state image sensor 624. The lens alignment with respect to the solid-state image sensor 624 is not an object of the solid-state image sensing device 600 in the first place.

SUMMARY OF THE INVENTION

The present invention is made in consideration of the problems, and an object thereof is to provide a solid-state image sensing device having a high lens alignment precision with respect to a solid-state image sensor, and an electronic apparatus incorporating such a solid-state image sensing device.

In order to attain the object, a solid-state image sensing device of the present invention includes an image sensing unit which includes a solid-state image sensor mounted on a circuit board, and a transparent lid section arranged so as to face a receiving surface of the solid-state image sensor with a space therebetween; and an optical unit which includes at least one lens for guiding light from outside to the receiving surface of the solid-state image sensor and a lens holder for holding the lens therein, wherein: the transparent lid section and the lens are independent of each other; and lens alignment with respect to the solid-state image sensor is performed by engaging the transparent lid section with the lens holder by mounting the lens on the transparent lid section.

According to the arrangement, a lens is aligned with respect to a solid-state image sensor by a lens holder engaging with a transparent lid section, when the lens is mounted on the transparent lid section. That is to say, the lens is aligned by the lens itself, based on the transparent lid section arranged in the vicinity of the solid-state image sensor. The lens alignment is thus possible with no regards to (i) the manufacturing variation of the circuit board on which the solid-state image sensor is to be mounted; and (ii) the precision of the position of the lens by the lens holder (precision in the lens holding position). Furthermore, the lens holder and the transparent lid section engage with each other when the lens is aligned. This enables to prevent disposition of the aligned lens.

According to the arrangement, the lens is aligned not only by the lens and the transparent lid section, but also the lens holder and the transparent lid section. Therefore, it is possible to provide a solid-state image sensing device having high lens alignment precision with respect to the solid-state image sensor of the lens.

What is meant by "lens alignment with respect to the solid-state image sensor" is a state where (i) an optical axis of the lens is perpendicular to the receiving surface of the solid-state image sensor; and (ii) an optical center of the receiving surface is concentric to the optical axis of the lens.

In order to attain the object, an electronic apparatus of the present invention incorporates the solid-state image sensing device. According to the arrangement, it is possible to provide an electronic apparatus having a high lens alignment precision with respect to the solid-state image sensor.

Additional objects, features, and strengths of the present invention will be made clear by the description below. Further, the advantages of the present invention will be evident from the following explanation in reference to the drawings.

DESCRIPTION OF THE EMBODIMENTS

One embodiment of the present invention is described below with reference to drawings.

A solid-state image sensing device of the present invention is suitable for electronic apparatuses capable of taking photographs, such as portable phones with a built-in camera, digital still cameras, and security cameras. The present embodiment describes a camera module (solid-state image sensing device) applied to a portable phone with a built-in camera.

Figure 1:
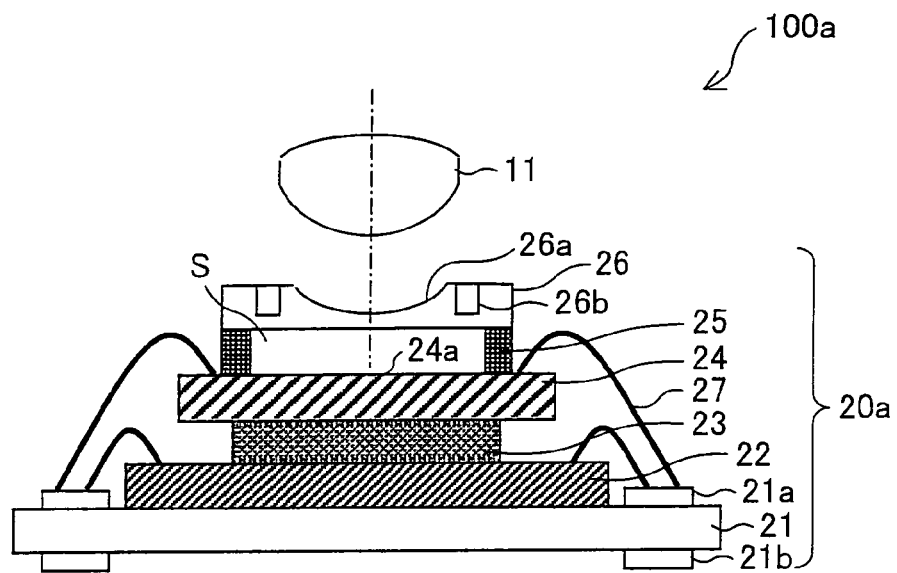
FIG. 1 is a cross sectional view illustrating a state where a lens has not been subjected to alignment in a camera module of one embodiment of the present invention.
Figure 2:
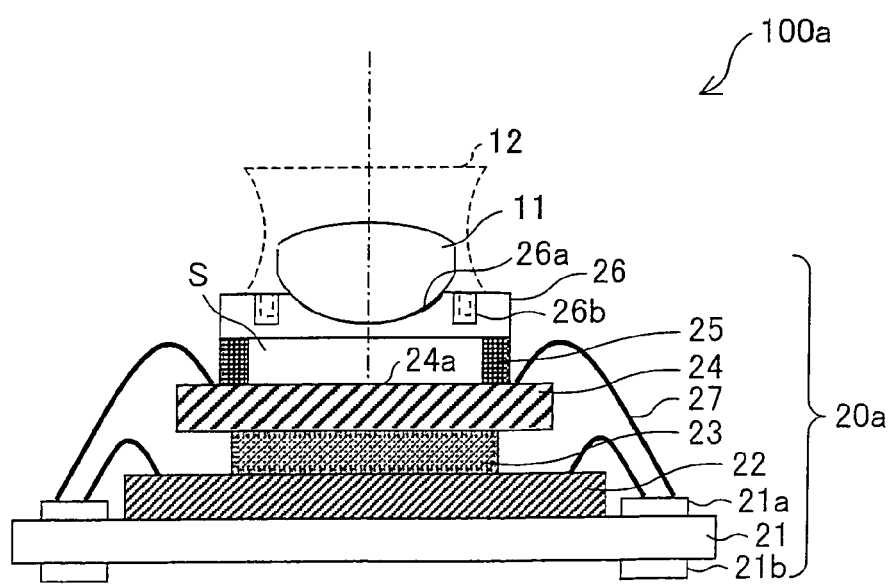
FIG. 2 is a cross sectional view illustrating a state where the lens has been subjected to the alignment in the camera module shown in FIG. 1.

FIGS. 1 and 2 are cross sectional views of a camera module 100a of the present embodiment. As later described, FIG. 1 illustrates a state where a lens 11 has not been subjected to alignment, and FIG. 2 illustrates a state where the lens 11 has been subjected to the alignment. The camera module 100a is manufactured by combining a lens unit (optical unit) 10a and an image sensing unit 20a. The lens unit 10a is mounted on the image sensing unit 20a. For the sake of easy explanation, the side where the lens unit 10a is located is denoted as an upper side, and the side where the image sensing unit 20a is located is denoted as a lower side in the following description.

<Lens Unit 10a>

The following description deals with the lens unit 10a. FIG. 2 is a cross sectional view of the lens unit 10a.

The lens unit 10a is a photographic optical system (optical structure) which forms a subject image. Namely, the lens unit 10a is an optical path demarcation device for guiding light from an outside to a receiving surface (image sensing surface) of the image sensing unit 20a.

The lens unit 10a is constructed of a lens 11 and a lens holder 12, as illustrated in FIG. 2.

The lens 11 guides light from the outside to the image sensing unit 20a. The camera module 100a includes one (single) lens 11. In the camera module 100a, the lens 11, as later described, is mounted on a depression 26a formed on a transparent lid section 26 included in the image sensing unit 20a. This thus aligns the lens 11 in high precision. An explanation regarding the alignment is later mentioned. There may be one lens 11, or there may be a plurality of lenses 11.

The lens holder 12 is a frame body for holding (supporting) the lens 11 therein. The lens 11 is arranged in the upper center of the lens holder 12. The lens holder 12 is a hollow (tubular) member, and the lens 11 is held therein. Therefore, an optical path is secured from the lens 11 to a receiving surface 24a of a solid-state image sensor 24.

A plurality of projections 12a is formed on a bottom surface (lower surface) of the lens holder 12. The projections 12a are for engaging the lens holder 12 to the transparent lid section 26 of the image sensing unit 20a, as later described. Namely, the projections 12a are alignment sections of the lens holder 12 to the image sensing unit 20a.

<Image Sensing Unit 20a>

The following description deals with the image sensing unit 20a.

The image sensing unit 20a is an image sensing section which converts a subject image formed by the lens unit 10a to electric signals. In other words, the image sensing unit 20a is a sensor device which photoelectrically converts incident light from the lens unit 10a.

The image sensing unit 20a includes a circuit board 21, a DSP (digital signal processor) 22, a spacer 23, the solid-state image sensor 24, an adhesive section 25, and the transparent lid section 26, as illustrated in FIGS. 1 and 2. The DSP 22, the spacer 23, the solid-state image sensor 24, the adhesive section 25 and the transparent lid section 26 are stacked on the circuit board 21. Terminals 21a are formed on a surface of the circuit board 21 (surface on which the DSP 22 and the other components are mounted). The terminals 21a are electrically connected to the DSP 22 and the solid-state image sensor 24 via wires 27, respectively.

The following description deals with each of the members included in the image sensing unit 20a in detail, with reference to FIGS. 1 and 2.

The circuit board 21 is a board which has a patterned wiring (not illustrated). The circuit board 21 is, for example, a print board, a ceramic board, or the like. The terminals 21a for wire bonding and electrodes 21b for external connection are formed on the top surface and the bottom surface of the circuit board 21, respectively. The terminals 21a and the electrodes 21b are electrically connected with each other.

The terminals 21a are electrically connected with the DSP 22 and the solid-state image sensor 24 via the wires 27, respectively. The DSP 22 and the solid-state image sensor 24 are stacked on a central part of the circuit board 21. The electrical connection of these components enable sending and receiving of electric signals. The electrodes 21b enable input and output of signals between the camera module 100a and the electronic apparatus such as a digital camera or a portable phone with a built-in camera, which are equipped with the camera module 100a.

The DSP 22 is a semiconductor chip which controls the performance of the solid-state image sensor 24, and processes the signal outputted from the solid-state image sensor 24. The circuit board 21 has other electronic components thereon, such as a CPU, a ROM, and a RAM, though these are not illustrated. The CPU performs various operation processes in accordance with a program. The ROM stores the program, and the RAM stores data and the like for each of the processes. These electronic components control the camera module 100a as a whole.

On the surface of the DSP 22, a plurality of bonding pads (not illustrated) are formed for input and output of electric signals.

The spacer 23 is arranged between the DSP 22 and the solid-state image sensor 24. The spacer 23 adjusts the distance between the DSP 22 and the solid-state image sensor 24. Specifically, the height of the spacer 23 is adjusted so as to avoid contact of the wire 27 to be connected to the DSP 22 and the wire 27 to be connected to the solid-state image sensor 24. For the spacer 23, for example, a silicon piece will be applied.

The solid-state image sensor 24 converts the subject image formed by the lens unit 10a to electric signals. In other words, the solid-state image sensor 24 is a sensor device which photoelectrically converts incident light from the lens unit 10a. The solid-state image sensor 24 is, for example, a CCD or a CMOS sensor IC. A receiving surface 24a is formed on the surface (top surface) of the solid-state image sensor 24. The receiving surface 24a has a plurality of pixels arranged in matrix form. The receiving surface 24a is an area which transmits the incident light from the lens unit 10a (transmitting area). The image sensing surface of the image sensing unit 20a is this receiving surface (pixel area) 24a.

The solid-state image sensor 24 converts the subject image formed on the receiving surface (pixel area) 24a to electric signals. The electric signals are then outputted as analog image signals. That is to say, photoelectric conversion is performed on the receiving surface 24a. The operation of the solid-state image sensor 24 is controlled at the DSP 22. The image signals created at the solid-state image sensor 24 is processed at the DSP 22.

The adhesive section 25 adheres the solid-state image sensor 24 with the transparent lid section 26. The adhesive section 25 is provided on a surrounding of the receiving surface 24a of the solid-state image sensor 24, and adheres the transparent lid section 26 on the solid-state image sensor 24. The receiving surface of the solid-state image sensor 24 is thus covered by the transparent lid section 26. More specifically, the adhesive section 25 adheres the solid-state image sensor 24 and the transparent lid section 26 so as to: (i) have the transparent lid section 26 face the receiving surface 24a of the solid-state image sensor 24; and (ii) form a space (gap, blank) therebetween.

The transparent lid section 26 is formed from transparent members such as glass or resin. An infrared ray insulating film may be formed on a surface (surface on which the lens 11 is to be mounted) of the transparent lid section 26. This allows the transparent lid section 26 to have a function to block infrared rays.

Figure 3:
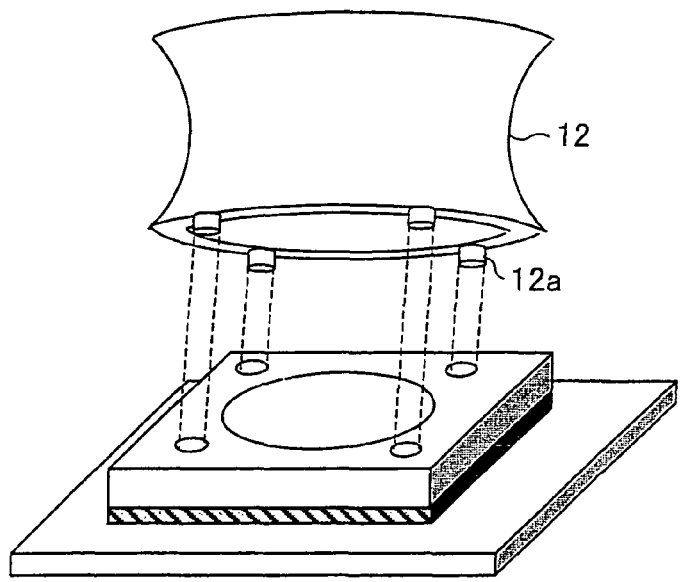
FIG. 3 is a perspective view illustrating an engagement of a lens holder and a transparent lid section in an image sensing unit of the camera module shown in FIG. 1.

A depression 26a is provided on a central part of the surface (top surface) of the transparent lid section 26, and alignment holes 26b are provided on a peripheral part of the surface of the transparent lid section 26. The depression 26a is provided through the optical path (in the optical path), and the alignment holes 26b are provided outside the optical path (a position such that the optical path is not blocked). As later described, the depression 26a is where the lens 11 is to be mounted. On the other hand, the projections 12a are inserted in the alignment holes 26b, in order to engage the lens holder 12 with the transparent lid section 26, as illustrated in FIG. 3. As such, the depression 26a is the alignment section of the lens 11, and the alignment holes 26b is the alignment sections of the lens holder 12. The alignment holes 26b do not fully pass through the transparent lid section 26.

The camera module 100a performs capturing an image as follows. Firstly, light from the outside is guided to the receiving surface (image sensing surface) of the image sensing unit 20a by the lens unit 10a, and a subject image is formed thereon. The subject image is converted to electric signals at the image sensing unit 20a. The image sensing unit 20a performs various processes (such as image processing) to the electric signals.

A principal feature of the camera module 100a of the present embodiment is that the lens 11 is aligned with respect to the solid-state image sensor 24 by having the lens 11 mounted on the transparent lid section 26.

Figure 4A:
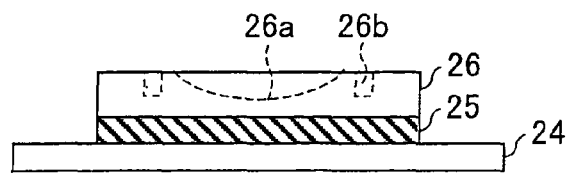
FIG. 4(a) is a side view of the image sensing unit shown in FIG. 3.
Figure 4B:
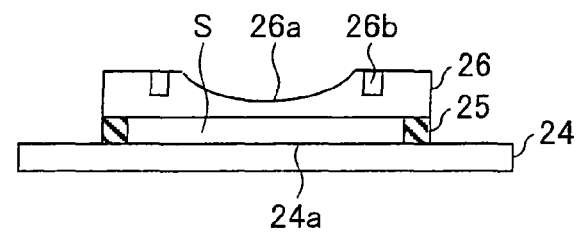
FIG. 4(b) is a cross sectional view of a center part of the image sensing unit shown in FIG. 3.
Figure 5A:
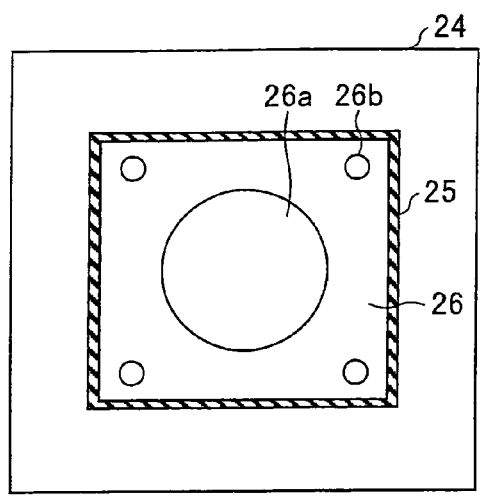
FIG. 5(a) is a top view of the image sensing unit shown in FIG. 3.
Figure 5B:
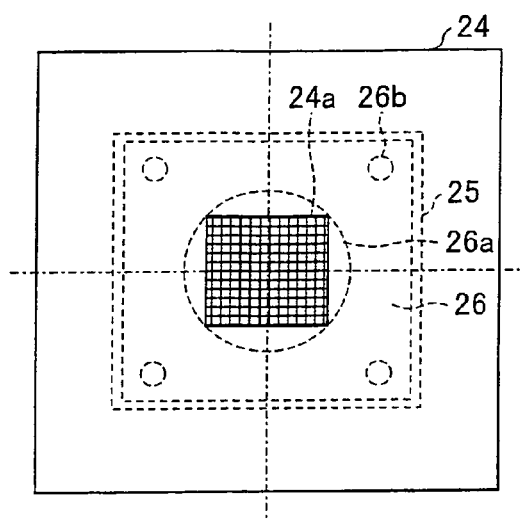
FIG. 5(b) is a perspective view of FIG. 5(a).

The following description deals with the feature with reference to FIGS. 1, and 3 through 5(b). Each of the FIGS. 3 through 5(b) illustrates the solid-state image sensor 24 and the transparent lid section 26 in the image sensing unit 20a. More specifically, FIG. 3 is a perspective view illustrating the solid-state image sensor 24 and the transparent lid section 26 in the image sensing unit 20a of the camera module 100a. FIG. 4(a) is a side view of the solid-state image sensor 24 and the transparent lid section 26 shown in FIG. 3. FIG. 4(b) is a cross sectional view of a center part of the solid-state image sensor 24 and the transparent lid section 26 shown in FIG. 3. FIG. 5(a) is a top view of the solid-state image sensor 24 and the transparent lid section 26 shown in FIG. 3. FIG. 5(b) is a perspective view of FIG. 5(a).

As shown in FIGS. 3, 4(a), 5(a) and 5(b), the adhesive section 25 is provided so as to peripherally surround the receiving surface 24a of the solid-state image sensor 24. The adhesive section 25 adheres the transparent lid section 26 to the solid-state image sensor 24, so as to face the receiving surface 24a of the solid-state image sensor 24. The adhesive section 25 adheres the receiving surface 24a of the solid-state image sensor 24 and the transparent lid section 26 so that a space S is formed therebetween, as illustrated in FIG. 4(b). Forming such sealed space S prevents the penetration of moisture to the receiving surface 24a, and the penetration and adhering of dust on the receiving surface 24a. Thus, occurrence of malfunction on the receiving surface 24a is prevented. In addition, the adhesive section 25 is formed on the whole periphery part of the receiving surface 24a, thereby peeling-off of the adhering of the transparent lid section 26 would not occur.

The adhesive section 25 is formed by, for example, a patterning which processes exposure and development by photolithography technique, following the attachment of a sheet-shaped adhesive on the solid-state image sensor 24. The use of the photolithography technique allows high precision patterning of the adhesive section 25. In addition, the use of the sheet-shaped adhesives allows even thickness of the adhesive section 25. Thus, the transparent lid section 26 is adhered in high precision, to the receiving surface 24a of the solid-state image sensor 24.

As such, in the camera module 100a, the lens 11 independent of the transparent lid section 26 is aligned by mounting the lens 11 to the transparent lid section 26, based on the transparent lid section 26 adhered in high precision with respect to the solid-state image sensor 24.

More specifically, as illustrated in FIGS. 3, 4(a), 4(b), 5(a) and 5(b), the depression (groove) 26a is formed on the surface of the transparent lid section 26 which faces the lens 11. The lens 11 is aligned based on the depression 26a. In more details, when the lens 11 is mounted on the depression 26a in the camera module 100a, the transparent lid section 26 and the lens 11 engage with each other. In addition, when the lens 11 is mounted on the depression 26a, the lens holder 12 engages with the alignment hole 26b of the transparent lid section 26. When the transparent lid section 26 engages with the lens 11, and the transparent lid section 26 engages with the lens holder 12, the lens 11 is aligned with the solid-state image sensor 24 in high precision.

What is meant by "alignment of the lens 11 with respect to the solid-state image sensor 24" is a state where (i) an optical axis (one-dot chain line in FIG. 1) of the lens 11 is perpendicular to the receiving surface 24a of the solid-state image sensor 24; and (ii) an optical center of the receiving surface 24a is concentric to the optical axis of the lens 11, as illustrated in FIG. 1. What is meant by "the optical center of the receiving surface 24a" is a center of the receiving surface 24a as illustrated by an intersection point of the one-dot chain line in FIG. 5(b).

In the camera module 100a, the lens 11 is aligned with respect to the solid-state image sensor 24 by the engagement of the lens holder 12 and the transparent lid section 26, by mounting the lens 11 on the transparent lid section 26. That is to say, the lens 11 is aligned by mounting the lens 11 on the groove 26a of the transparent lid section 26, based on the transparent lid section 26 mounted in high precision in the vicinity of the solid-state image sensor 24. As such, the lens 11 itself as well as the transparent lid section 26 is involved in the alignment of the lens 11. This thus allows the alignment of the lens 11 with no regards to (i) the manufacturing variation of the circuit board 21 on which the solid-state image sensor 24 is to be mounted; and (ii) the precision of position of the lens 11 by the lens holder 12 (precision in lens holding position). Furthermore, it is possible to prevent the disposition of the aligned lens 11, since the lens holder 12 and the transparent lid section 26 engage with each other when the lens 11 is aligned.

As such, in the camera module 100a, the lens 11 is aligned not only by the lens 11 and the transparent lid section 26, but also the lens holder 12 and the transparent lid section 26. Therefore, it is possible to provide a camera module 100a having the high alignment precision of the lens 11 with respect to the solid-state image sensor 24.

Particularly, if the depression 26a of the transparent lid section 26 is a recess section and the lens 11 is a protruded section, the transparent lid section 26 and the lens 11 can be engaged with each other securely when the transparent lid section 26 and the lens 11 are in contact with each other. Consequently, it is possible to mount the lens 11 securely on a specific position (groove 26a) on the transparent lid section 26. This thus allows further high precision alignment of the lens 11.

In addition, by thus engaging the lens 11 and the transparent lid section 26, the lens unit 10a and the image sensing unit 20a can be fixed detachably from each other, without the use of an adhesive. Therefore, detachment and attachment of the lens unit 10a and the image sensing unit 20a, and replacement of a broken unit is easily performed.

In the camera module 100a, the lens holder 12 and the transparent lid section 26 engage with each other, by inserting the projections 12a provided on the lens holder 12 to the alignment holes 26a provided on the transparent lid section 26. This securely arranges the lens holder 12 on the specific position on the transparent lid section 26. Therefore, a further high alignment of the lens 11 is possible.

In the camera module 100a, it is preferable for the alignment of the lens 11 to be performed on an optical path of the transparent lid section 26 (on a path from the lens 11 to the receiving surface 24a of the solid-state image sensor). If the lens 11 is aligned on the optical path in a central part of the transparent lid section 26, and not in a peripheral part (outside the optical path) of the transparent lid section 26, the lens 11 can be aligned even if the variation of the circuit board 21 is great.

Figure 6A:
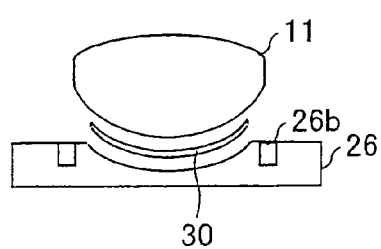
FIG. 6(a) is a cross sectional view illustrating an arrangement where a cushioning member is provided between a lens and a transparent lid section.
Figure 6B:
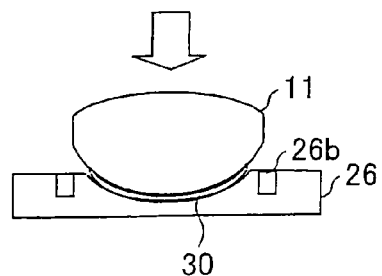
FIG. 6(b) is a cross sectional view illustrating an arrangement where a cushioning member is provided between a lens and a transparent lid section.

The lens 11 and the transparent lid section 26 are in contact with each other in the camera module 100a. Thus, the alignment of the lens 11 is performed. However, the lens alignment is not limited to just the lens 11 and the transparent lid section 26 to be in contact with each other. For example, FIGS. 6(a) and 6(b) are cross sectional views illustrating an arrangement which provides a cushioning member 30 between the transparent lid section 26 and the lens 11. The arrangement may be one which the transparent cushioning member is provided between the transparent lid section 26 and the lens 11, as illustrated in FIG. 6. Namely, the arrangement may be one such that the lens 11 is mounted on (or engaged to) the transparent lid section 26 via the transparent cushioning member 30. The cushioning member 30 enables to absorb shock towards the transparent lid section 26 and the lens 11. Furthermore, it is possible to make the fine adjustments to the position of the lens 11 with the cushioning member 30. The fine adjustments of the position of the lens 11 by using the cushioning member 30 is accomplished by, for example, pressing or screwing the lens 11 as illustrated in the arrow in FIG. 6(b). This allows the fine adjustments to the focal length. The cushioning member 30 may be made of a transparent material (for example, resin, rubber, fiber, or other material) so as not to obstruct condensation by the lens 11.

Figure 7A:
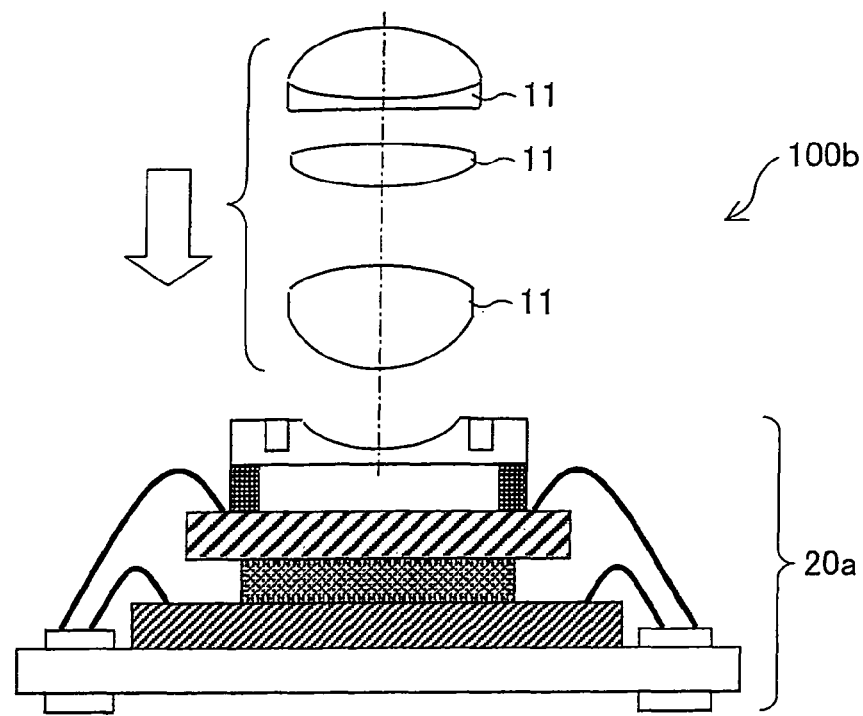
FIG. 7(a) is a cross sectional view illustrating a state where a lens has not been subjected to alignment in a camera module of another embodiment of the present invention.
Figure 7B:
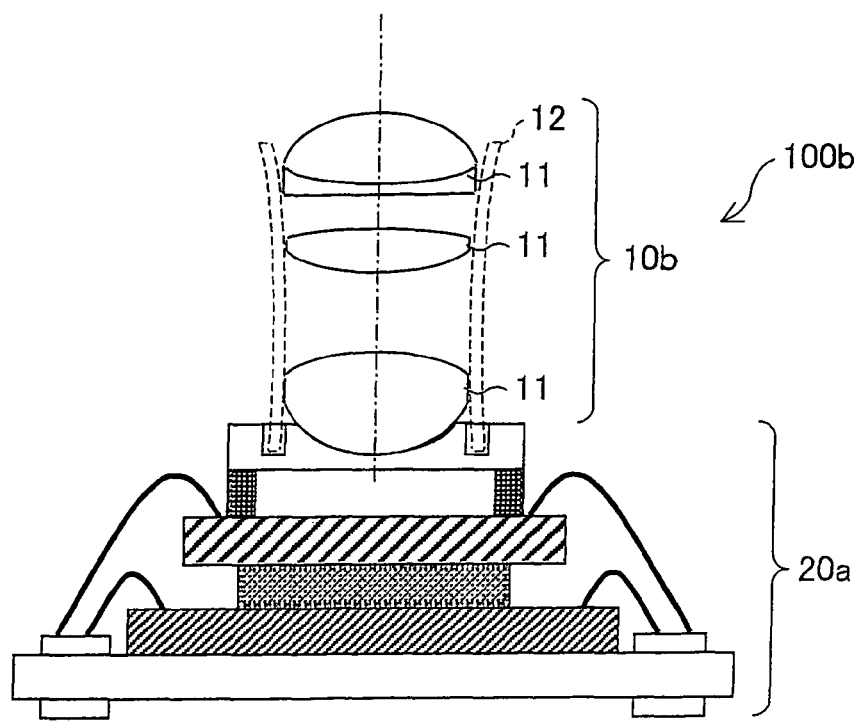
FIG. 7(b) is a cross sectional view illustrating a state where the lens has been subjected to the alignment in the camera module shown in FIG. 7(a).

The camera module 100a is arranged such that the single lens 11 is provided, however may be arranged so that a plurality of lenses 11 are provided. FIG. 7(a) is a cross sectional view of a camera module 100b including a lens group which includes a plurality of lenses 11. FIG. 7(a) illustrates a state where the lenses 11 have not been subjected to alignment, and FIG. 7(b) illustrates a state where the lenses 11 have been subjected to the alignment. The camera module 100b is constructed of a lens unit 10b and the foregoing image sensing unit 20a. The difference to the camera module 100a is that the camera module 100b includes the plurality of lenses 11. In the camera module 10b, the lens 11 which is in contact with the transparent lid section 26 is fixed, and at least a few of the lens(es) 11 of the rest of the lenses 11 is/are arranged in a movable state. That is to say, the camera module 100b has an arrangement which possesses an automatic focusing function. In the camera module 100b, the optical axis of the lenses 11 other than the lens 11 closest to the transparent lid section 26 (the lens 11 which is in contact with the transparent lid section 26) is set concentric to the optical axis of the lens 11 closest to the transparent lid section 26, based on the optical axis of the lens 11 closest to the transparent lid section 26. The lens 11 closest to the transparent lid section 26 is arranged on the transparent lid section 26, whereby the lenses 11 are aligned. Therefore, it is possible to align all of the lenses 11 with respect to the solid-state image sensor 24 and also have the optical axis of all the lenses 11 concentric to each other, just by mounting (preferably engaging) the lens 11 on the transparent lid section 26.

As such, in the camera module 10b, the alignment of lenses 11 is performed based on the lens 11 which is in contact with the transparent lid section 26 (the lens closest to the transparent lid section). In addition, the holding position of the lenses 11 other than the lens 11 which is in contact with the transparent lid section 26 is arranged in a changeable state. The alignment of the lenses 11 with respect to the solid-state image sensor 24 in high precision is thus possible, in the camera module 100b which has the automatic focusing function.

Figure 8:
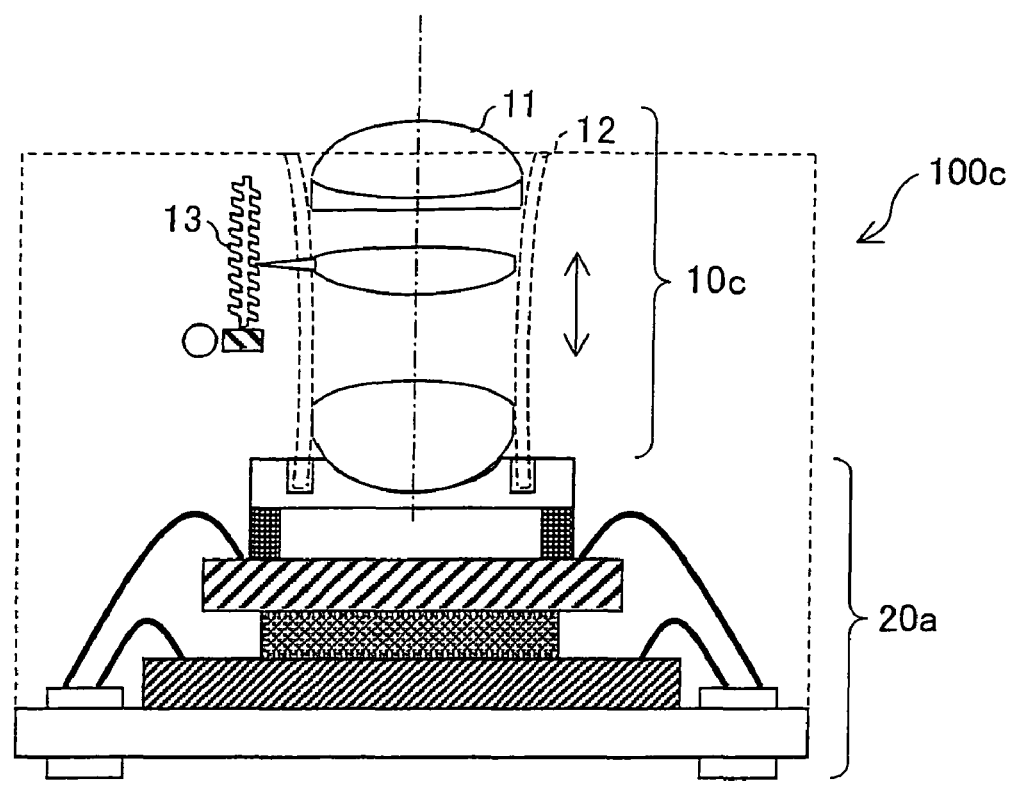
FIG. 8 is a cross sectional view illustrating a state where a lens has been subjected to alignment in a camera module of still another embodiment of the present invention.

FIG. 8 is a cross sectional view of a camera module 100c, which possesses a zooming mechanism. The camera module 100c is constructed of a lens unit 10c and the foregoing image sensing unit 20a. The lens unit 10c includes a plurality of lenses 11, a lens holder 12 and a lens drive 13. The difference to the camera module 100a is this lens unit 10c. The lens unit 10c is arranged such that the base lens 11 which is in contact with the transparent lid section 26 and the objective (uppermost) lens 11 are fixed, and the lens 11 in the middle is driven by the lens drive 13. As similar to the camera module 100b, in the camera module 100c, the optical axis of the lenses 11 other than the lens 11 closest to the transparent lid section 26 (the lens 11 which is in contact with the transparent lid section 26) is set concentric to the optical axis of the lens 11 closest to the transparent lid section 26, based on the optical axis of the lens 11 closest to the transparent lid section 26. The lens 11 closest to the transparent lid section 26 is arranged on the transparent lid section 26, whereby the lenses 11 are aligned. Therefore, it is possible to align all of the lenses 11 with respect to the solid-state image sensor 24 and also have the optical axis of all of the lenses 11 concentric to each other, just by mounting (preferably engaging) the lens 11 on the transparent lid section 26. Thus, it is possible to align the lenses 11 with respect to the solid-state image sensor 24 in high precision in the camera module 100b having the automatic focusing function.

The camera module 100c may be arranged such that the lens unit 10c and the image sensing unit 20a are collectively sealed with resin, as illustrated by the broken line in FIG. 8. With this arrangement, the lens unit 10c and the image sensing unit 20a do not separate even if shock or the like is received. Therefore, it is advantageous that shock-resistance and environmental-resistance of the camera module 100c are improved. Note that "shock-resistance" indicates the decrease in failure rate, caused by dropping the camera module, or the camera module receiving shock or vibration. Particularly, breakage of packaging is less likely to occur in the camera module. "Environmental-resistance" indicates that penetration of moisture (water), dust, chemical substances, aggressive gas and the like are prevented when storing, using or doing any other operation with the camera module.

Figure 9A:
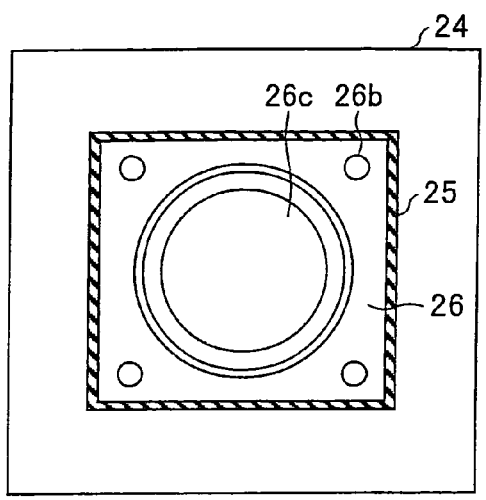
FIG. 9(a) is a top view illustrating another arrangement of an image sensing unit in a camera module of the present invention.
Figure 9B:
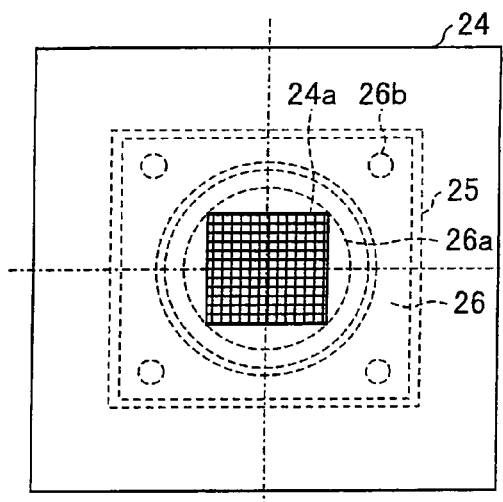
FIG. 9(b) is a perspective view of the image sensing unit shown in FIG. 9(a).
Figure 10A:
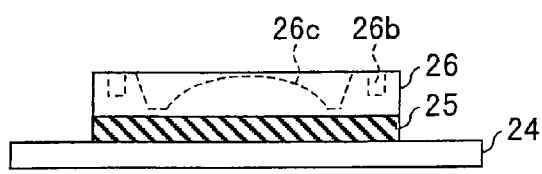
FIG. 10(a) is a side view of the image sensing unit shown in FIG. 9(a).
Figure 10B:
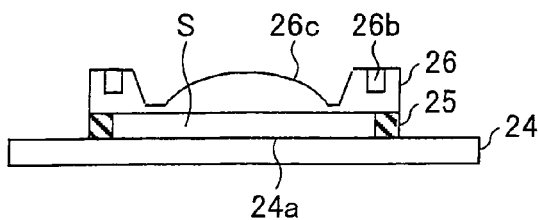
FIG. 10(b) is a cross sectional view of a center part of the image sensing unit shown in FIG. 9(a).
Figure 11:
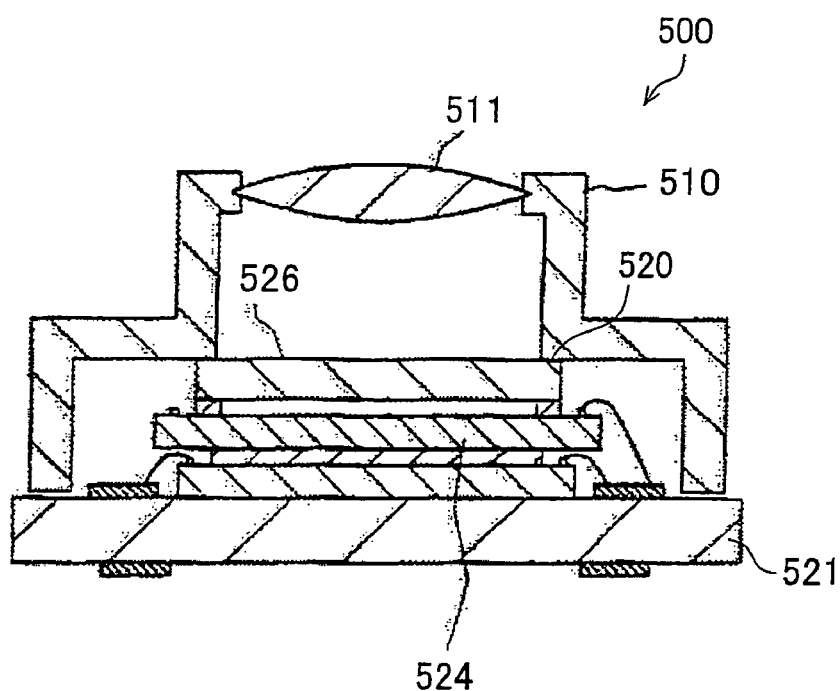
FIG. 11 is a cross sectional view illustrating a solid-state image sensing device described in Patent Document 1.
Figure 12:
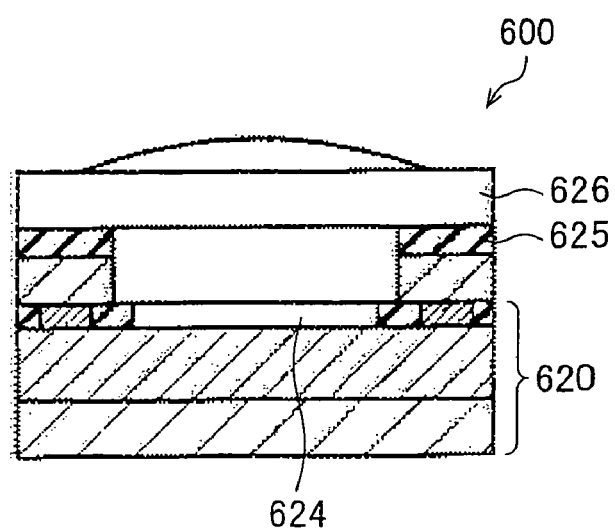
FIG. 12 is a cross sectional view illustrating a solid-state image sensing device described in Patent Document 2.

In the camera module 100a, the lens 11 is aligned by the depression (groove, recess section) 26a formed on the transparent lid section 26 and the lens 11 having a convex surface corresponding to the depression 26a. The shape of the transparent lid section 26 and the lens 11 however are not limited to this, and the alignment may be done in an opposite way. For example, FIGS. 9(a) and 9(b) are top views illustrating another arrangement of the transparent lid section 26. FIG. 10(a) is a side view of FIG. 9(a), and FIG. 10(b) is a cross sectional view of the center part of FIG. 9(a). In this arrangement, a protruded section 26c is formed on the transparent lid section 26 instead of the depression 26a. In this arrangement, the lens 11 is aligned by the lens 11 having a concave surface (not illustrated) which corresponds to the protruded section 26c. Even with such arrangement, the same effect is attained as in the camera module 100a.

A material for the transparent lid section 26 and the lens 11 is not particularly limited. However, it is preferable for the transparent lid section 26 and the lens 11 to be made of resin. This thus enables the manufacturing of the transparent lid section 26 and the lens 11 by using a mould. As a result, the manufacturing variation is prevented. This thus securely mounts the lens 11 on the specific position on the transparent lid section 26. Therefore, it is possible to align the lens 11 in further high precision. In addition, if the transparent lid section 26 is made of resin, the transparent lid section 26 is processed at ease compared to the transparent lid section 26 made of glass or the like.

It is preferable for the lens 11 and the lens holder 12 to also be made of resin. More specifically, the lens 11 is made of transparent resin, and the lens holder 12 is made of colored resin (resin with color), for example. By thus constructing the lens 11 and the lens holder 12 with resin, the lens unit 10a can be molded integrally. As such, an integrally molded lens unit 10a improves the shock-resistance and the environmental-resistance of the camera module 100a. Use of colored resin as the resin for the lens holder 12 enhances the light blocking effect of the lens holder 12.

As described, the solid-state image sensing device of the present invention is arranged such that the transparent lid section and the lens are independent of each other, and the lens alignment with respect to the solid-state image sensor is performed by engaging the transparent lid section with the lens holder by mounting the lens on the transparent lid section. This thus allows the lens alignment with no regards to (i) the manufacturing variation of the circuit board; and (ii) the precision of the position of the lens by the lens holder. Furthermore, it is possible to prevent the disposition of the aligned lens due to the engagement of the lens holder and the transparent lid section. Therefore, a solid-state image sensing device having a high lens alignment precision with respect to the solid-state image sensor is provided.

The solid-state image sensing device of the present invention is preferably arranged such that projections formed on the lens holder and alignment holes formed on the transparent lid section engage with each other.

According to the arrangement, the lens holder and the transparent lid section engage with each other, by inserting the projections formed on the lens holder to the alignment holes formed on the transparent lid section. This securely arranges the lens holder in the specific position on the transparent lid section. As a result, the lens is securely arranged on the specific position on the transparent lid section. Therefore, it is possible to align the lens in further high precision.

The solid-state image sensing device of the present invention is preferably arranged such that the lens alignment is performed on an optical path.

According to the arrangement, the lens is aligned on an optical path of the transparent lid section, not in a peripheral part (outside the optical path) of the transparent lid section. This enables to perform the lens alignment even if the variation of the circuit board is great.

The solid-state image sensing device of the present invention is preferably arranged such that the lens alignment is performed by engaging the transparent lid section with the lens.

According to the arrangement, the lens is aligned by an engagement of the transparent lid section and the lens. The lens is thus securely mounted on the specific position on the transparent lid section. Therefore, it is possible to align the lens in further high precision.

The solid-state image sensing device of the present invention is preferably includes a transparent cushioning member between the transparent lid section and the lens.

According to the arrangement, the lens is mounted on the transparent lid section via a transparent cushioning section. This enables to absorb the shock received by the transparent lid section and the lens.

The solid-state image sensing device of the present invention is preferably arranged such that the lens holder holds the lens so that a mounting state (alignment state) of the lens to the transparent lid section is changeable.

According to the arrangement, the mounting state of the lens on the transparent lid section (alignment state) is changeable by the lens holder. This allows the fine adjustment of the lens alignment. Therefore, it is possible to align the lens in further high precision.

The solid-state image sensing device of the present invention is preferably arranged such that the transparent lid section and the lens are made of resin.

According to the arrangement, the transparent lid section and the lens are made of resin. Consequently, the transparent lid section and the lens can be manufactured by using a mould. This thus prevents the occurrence of manufacturing variation, and allows the secure mounting of the lens on the specific position on the transparent lid section. Therefore, it is possible to align the lens in a further high precision.

The solid-state image sensing device of the present invention may be arranged such that the optical unit includes a plurality of lenses; the lens alignment with respect to the solid-state image sensor is performed by mounting, on the transparent lid section, one of the lenses that is closest to the transparent lid section; and the other one or ones of the lenses are set concentric to an optical axis of the lens closest to the transparent lid section.

According to the arrangement, the optical unit includes a group of lens which includes a plurality of lenses. The group of lens has an optical axis of the lens(es) other than the lens closest to the transparent lid section set concentric to the optical axis of the lens closest to the transparent lid section, based on the optical axis of the lens closest to the transparent lid section. The lens closest to the transparent lid section is arranged on the transparent lid section, whereby the lenses are aligned. Therefore, it is possible to align all of the lenses with respect to the solid-state image sensor and also have the optical axis of all of the lenses concentric to each other, just by mounting the lens on the transparent lid section.

The solid-state image sensing device of the present invention is preferably arranged such that a holding position of the other one or ones of the lenses held by the lens holder is/are changeable.

According to the arrangement, the holding position of the lens for performing the lens alignment (the lens closest to the transparent lid section) is changeable. This enables to improve the lens alignment precision with respect to the solid-state image sensing device which has the automatic focusing function or the zooming function.

An electronic apparatus of the present invention incorporates one of the aforementioned solid-state image sensing devices.

According to the arrangement, it is possible to provide an electronic apparatus in which the lens is aligned in high precision with respect to the solid-state image sensor.

The present invention may be applied for solid-state image sensing devices which are used to perform image sensing in various image sensing devices (electronic apparatuses) such as portable phones with a built-in camera, digital still cameras, security cameras, and cameras for the purpose of installing to portable phones, vehicles, and interphones. Furthermore, since the lens alignment precision is high, the present invention is adequately applicable to solid-state image sensing devices of which high functions are demanded.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A solid-state image sensing device comprising:
   an image sensing unit which includes a solid-state image sensor mounted on a circuit board, and a transparent lid section arranged so as to face a receiving surface of the solid-state image sensor with a space therebetween; and
   an optical unit which includes at least one lens for guiding light from outside to the receiving surface of the solid-state image sensor and a lens holder for holding the lens therein, wherein:
   the transparent lid section and the lens are independent of each other;
   lens alignment with respect to the solid-state image sensor is performed on an optical path extending from the lens to the receiving surface of the solid-state image sensor by engaging the transparent lid section and the lens holder by mounting the lens on the transparent lid section such that the transparent lid section and the lens engage with each other; and
   a transparent cushioning member is provided between the transparent lid section and the lens.

2. The solid-state image sensing device as set forth in claim 1, wherein
   projections provided on the lens holder engage with alignment holes provided on the transparent lid section.

3. The solid-state image sensing device as set forth in claim 1,
   wherein the lens holder holds the lens so that a mounting state of the lens to the transparent lid section is changeable.

4. The solid-state image sensing device as set forth in claim 1,
   wherein the transparent lid section and the lens are made of resin.

5. The solid-state image sensing device as set forth in claim 1,
   wherein:
   the optical unit includes a plurality of lenses;
   the lens alignment with respect to the solid-state image sensor is performed by mounting, on the transparent lid section, one of the lenses that is closest to the transparent lid section; and
   the other one or ones of the lenses are set concentric to an optical axis of the lens closest to the transparent lid section.

6. The solid-state image sensing device as set forth in claim 5,
   wherein a holding position of the other one or ones of the lenses held by the lens holder is/are changeable.

7. The solid-state image sensing device as set forth in claim 1,
   wherein the image sensing unit and the optical unit are collectively sealed with resin.

8. The solid-state image sensing device as set forth in claim 4,
   wherein:
   the lens is made of transparent resin; and
   the lens holder is made of colored resin.

9. The solid-state image sensing device as set forth in claim 3, comprising an automatic focusing function or a zooming function.

10. The solid-state image sensing device according to claim 1, wherein:
    the transparent lid section has a depression on a surface thereof that faces the lens, and
    the lens has a convex surface corresponding to the depression of the transparent lid section.

11. The solid-state image sensing device according to claim 1, wherein:
    the transparent lid section has a protruded section on a surface thereof that faces the lens, and
    the lens has a concave surface corresponding to the protruded section of the transparent lid section.

12. An electronic apparatus comprising a solid-state image sensing device, the solid-state image sensing device comprising:
    an image sensing unit which includes a solid-state image sensor mounted on a circuit board, and a transparent lid section arranged so as to face a receiving surface of the solid-state image sensor with a space therebetween; and an optical unit which includes at least one lens for guiding light from outside to the receiving surface of the solid-state image sensor and a lens holder for holding the lens therein, wherein:

the transparent lid section and the lens are independent of each other;

lens alignment with respect to the solid-state image sensor is performed on an optical path extending from the lens to the receiving surface of the solid-state image sensor by engaging the transparent lid section and the lens holder by mounting the lens on the transparent lid section such that the transparent lid section and the lens engage with each other; and a transparent cushioning member is provided between the transparent lid section and the lens.

13. A solid-state image sensing device comprising:

an image sensing unit which includes a solid-state image sensor mounted on a circuit board, and a transparent lid section arranged so as to face a receiving surface of the solid-state image sensor with a space therebetween;

an optical unit which includes at least one lens for guiding light from outside to the receiving surface of the solid-state image sensor and a lens holder for holding the lens therein; and a transparent cushioning member between the transparent lid section and the lens, wherein:

the transparent lid section and the lens are independent of each other; and lens alignment with respect to the solid-state image sensor is performed on an optical path extending from the lens to the receiving surface of the solid-state image sensor by engaging the transparent lid section and the lens holder by mounting the lens on the transparent lid section.

14. A solid-state image sensing device comprising:

an image sensing unit which includes a solid-state image sensor mounted on a circuit board, and a transparent lid section arranged so as to face a receiving surface of the solid-state image sensor with a space therebetween; and an optical unit which includes at least one lens for guiding light from outside to the receiving surface of the solid-state image sensor and a lens holder for holding the lens therein, wherein:

the transparent lid section and the lens are independent of each other;

lens alignment with respect to the solid-state image sensor is performed on an optical path extending from the lens to the receiving surface of the solid-state image sensor by engaging the transparent lid section and the lens holder by mounting the lens on the transparent lid section, the transparent lid section has a protruded section on a surface thereof that faces the lens, and the lens has a concave surface corresponding to the protruded section of the transparent lid section.

15. An electronic apparatus comprising a solid-state image sensing device, the solid-state image sensing device comprising:

an image sensing unit which includes a solid-state image sensor mounted on a circuit board, and a transparent lid section arranged so as to face a receiving surface of the solid-state image sensor with a space therebetween;

an optical unit which includes at least one lens for guiding light from outside to the receiving surface of the solid-state image sensor and a lens holder for holding the lens therein, and a transparent cushioning member between the transparent lid section and the lens, wherein:

the transparent lid section and the lens are independent of each other; and lens alignment with respect to the solid-state image sensor is performed on an optical path extending from the lens to the receiving surface of the solid-state image sensor by engaging the transparent lid section and the lens holder by mounting the lens on the transparent lid section.

\* \* \* \* \*